(12) United States Patent
Kim

(10) Patent No.: US 9,514,788 B1
(45) Date of Patent: Dec. 6, 2016

(54) DIFFERENTIAL AMPLIFIER CIRCUIT, VOLTAGE REGULATOR, AND SEMICONDUCTOR MEMORY DEVICE INCLUDING THE SAME

(71) Applicant: SK hynix Inc., Gyeonggi-do (KR)

(72) Inventor: Young-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/162,822

(22) Filed: May 24, 2016

(30) Foreign Application Priority Data

Dec. 23, 2015 (KR) .................. 10-2015-0185230

(51) Int. Cl.
| | |
|---|---|
| G11C 5/14 | (2006.01) |
| H03F 3/45 | (2006.01) |
| G05F 1/56 | (2006.01) |
| G11C 8/08 | (2006.01) |
| G11C 16/30 | (2006.01) |
| G11C 11/4074 | (2006.01) |

(52) U.S. Cl.
CPC ................. *G11C 5/147* (2013.01); *G05F 1/56* (2013.01); *G11C 5/145* (2013.01); *G11C 8/08* (2013.01); *G11C 16/30* (2013.01); *H03F 3/45273* (2013.01); *G11C 11/4074* (2013.01); *H03F 2203/45021* (2013.01); *H03F 2203/45112* (2013.01)

(58) Field of Classification Search
CPC ........... G11C 5/147; G11C 5/145; G11C 8/08; G11C 16/30; G11C 11/4074
USPC ................................................... 365/189.09
See application file for complete search history.

(56) References Cited

U.S. PATENT DOCUMENTS

| | | | | |
|---|---|---|---|---|
| 5,771,197 A | * | 6/1998 | Kim ...................... | G11C 7/065 365/203 |
| 6,087,859 A | * | 7/2000 | Lee ......................... | G11C 7/062 327/51 |
| 7,184,296 B2 | * | 2/2007 | Hatakeyama .......... | G11C 16/28 365/148 |
| 7,453,751 B2 | * | 11/2008 | Forbes ................... | G11C 7/062 365/202 |
| 8,031,001 B2 | * | 10/2011 | Ide ....................... | H03F 3/45183 330/259 |

FOREIGN PATENT DOCUMENTS

| | | |
|---|---|---|
| KR | 1020080097680 | 11/2008 |
| KR | 1020130068126 | 6/2013 |

* cited by examiner

*Primary Examiner* — Pho M Luu
(74) *Attorney, Agent, or Firm* — IP & T Group LLP

(57) ABSTRACT

The present invention relates to a differential amplifier circuit. A differential amplifier circuit has an advantage in that it can improve a voltage drop characteristic attributable to a load current by enhancing response speed. Furthermore, the differential amplifier circuit can improve a bandwidth characteristic by reducing the quiescent current of a class AB amplifier and also improve a slew rate characteristic by adaptively changing a tail current because a signal path is diversified. Accordingly, response speed can be enhanced by an improved bandwidth characteristic, and the current driving ability can be also enhanced by an improved slew rate characteristic.

25 Claims, 9 Drawing Sheets

DIFFERENTIAL AMPLIFIER CIRCUIT, VOLTAGE REGULATOR, AND SEMICONDUCTOR MEMORY DEVICE INCLUDING THE SAME

CROSS-REFERENCE TO RELATED APPLICATION

The present application claims priority of Korean Patent Application No. 10-2015-0185230, filed on Dec. 23, 2015, which is incorporated herein by reference in its entirety.

BACKGROUND

1. Field

Exemplary embodiments of the present invention relate to a semiconductor design technology, and more particularly, to a differential amplifier circuit for a low drop-out (LDO) voltage regulator.

2. Description of the Related Art

An electronic circuit includes an amplifier for amplifying a signal so that the signal is much greater than noise. In particular, the amplifier may be implemented using a differential amplifier for receiving differential input signals, performing a comparison between the differential input signals, amplifying the results of the comparison, and outputting an output signal. Accordingly, the differential amplifier is one of the most important elements forming the circuit, and the entire circuit performance may depend on the performance of the differential amplifier. Research is carried out on a differential amplifier of low power consumption because all of the recently developed electronic circuits are aimed at a fast operation for user needs and low power consumption.

A device for supplying stable power regardless of output impedance is called a voltage regulator. In particular, a regulator having a relatively small difference between an input voltage and an output voltage is called a low drop-out (LDO) voltage regulator. Such an LDO voltage regulator requires a differential amplifier characterized in that it can rapidly recover an output voltage when the output voltage is changed due to an instant change of a load current.

SUMMARY

Various embodiments are directed to the provision of a differential amplifier circuit for an LDO voltage regulator capable of rapidly recovering an output voltage when the output voltage is changed due to a change of a load current and a semiconductor memory device including the same.

Also, various embodiments are directed to the provision of a differential amplifier circuit capable of adaptively changing a tail current while reducing the quiescent current (Iq) of a class AB amplifier and a semiconductor memory device including the same.

In an embodiment, a differential amplifier circuit may include first and second main input units suitable for receiving a first input signal and a second input signal, respectively; a first current mirroring unit suitable for being coupled to a first terminal of the first main input unit and mirroring a current of the first input signal inputted to the first main input unit; a second current mirroring unit suitable for being coupled to a first terminal of the second main input unit and mirroring a current of the second input signal inputted to the second main input unit; an output unit suitable for generating an output voltage based on results of the mirroring of the first current mirroring unit and the second current mirroring unit; a first current control unit suitable for reducing a current mirrored by the first current mirroring unit by supplying the first terminal of the first main input unit with a first compensation current generated by re-mirroring the second input signal and reducing a current mirrored by the second current mirroring unit by supplying the first terminal of the second main input unit with a second compensation current generated by re-mirroring the first input signal; and a second current control unit suitable for controlling a tall current of the first main input unit in response to the second input signal and controlling a tail current of the second main input unit in response to the first input signal.

In an embodiment, a differential amplifier circuit may include first and second main input transistors suitable for having gates to which a first input signal and a second input signal are respectively inputted; a first current mirroring unit suitable for being coupled to a drain of the first main input transistor and mirroring a current of the first input signal inputted to the gate of the first main input transistor; a second current mirroring unit suitable for being coupled to a drain of the second main input transistor and mirroring a current of the second input signal inputted to the gate of the second main input transistor; an output unit suitable for generating an output voltage based on results of the mirroring of the first current mirroring unit and the second current mirroring unit; a first current control unit suitable for supplying the drain of the first main input transistor with a first compensation current generated in response to the second input signal and supplying the drain of the second main input transistor with a second compensation current generated in response to the first input signal; and a second current control unit suitable for controlling a tail current of the first main input transistor in response to the second input signal and controlling a tail current of the second main input transistor in response to the first input signal.

In an embodiment, a semiconductor memory device may include a memory cell array suitable for comprising a plurality of memory cells coupled to a plurality of bit line pairs and a plurality of word lines; a peripheral circuit suitable for reading data from a memory cell corresponding to an input address when a read operation is performed and programming data into a memory cell corresponding to an input address when a program operation is performed; and a voltage regulator suitable for supplying a constant supply voltage to the peripheral circuit, wherein the voltage regulator comprises a differential amplifier suitable for reducing a current flowing through a current mirroring unit for mirroring a positive input signal and a negative input signal by supplying a positive input terminal with a first compensation current generated in response to the negative input signal and supplying a negative input terminal with a second compensation current generated in response to the positive input signal and for simultaneously controlling a tail current of the negative input terminal in response to the positive input signal and controlling a tail current of the positive input terminal in response to the negative input signal.

DETAILED DESCRIPTION

Figure 1:
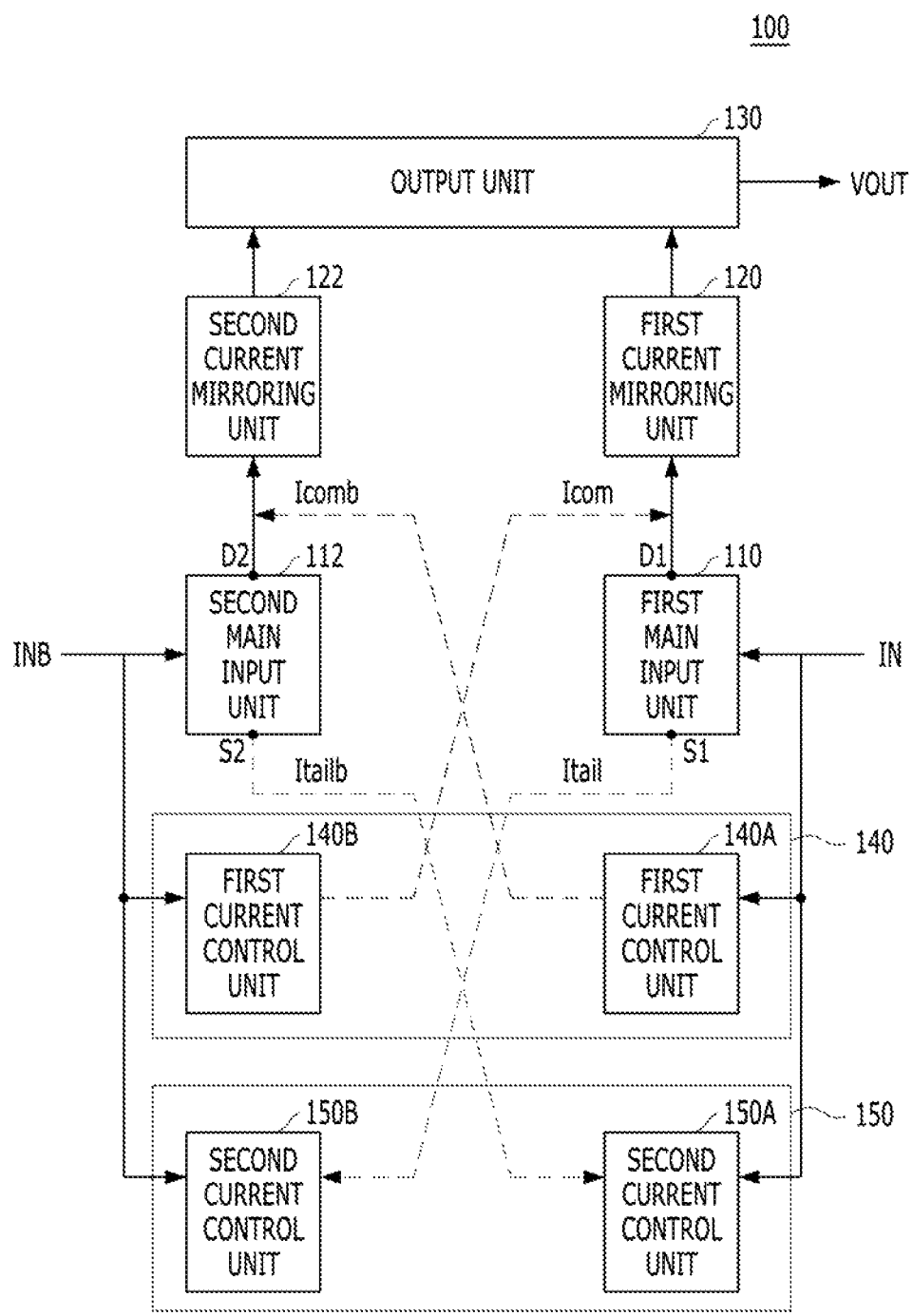
FIG. 1 is a schematic block diagram of a differential amplifier in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
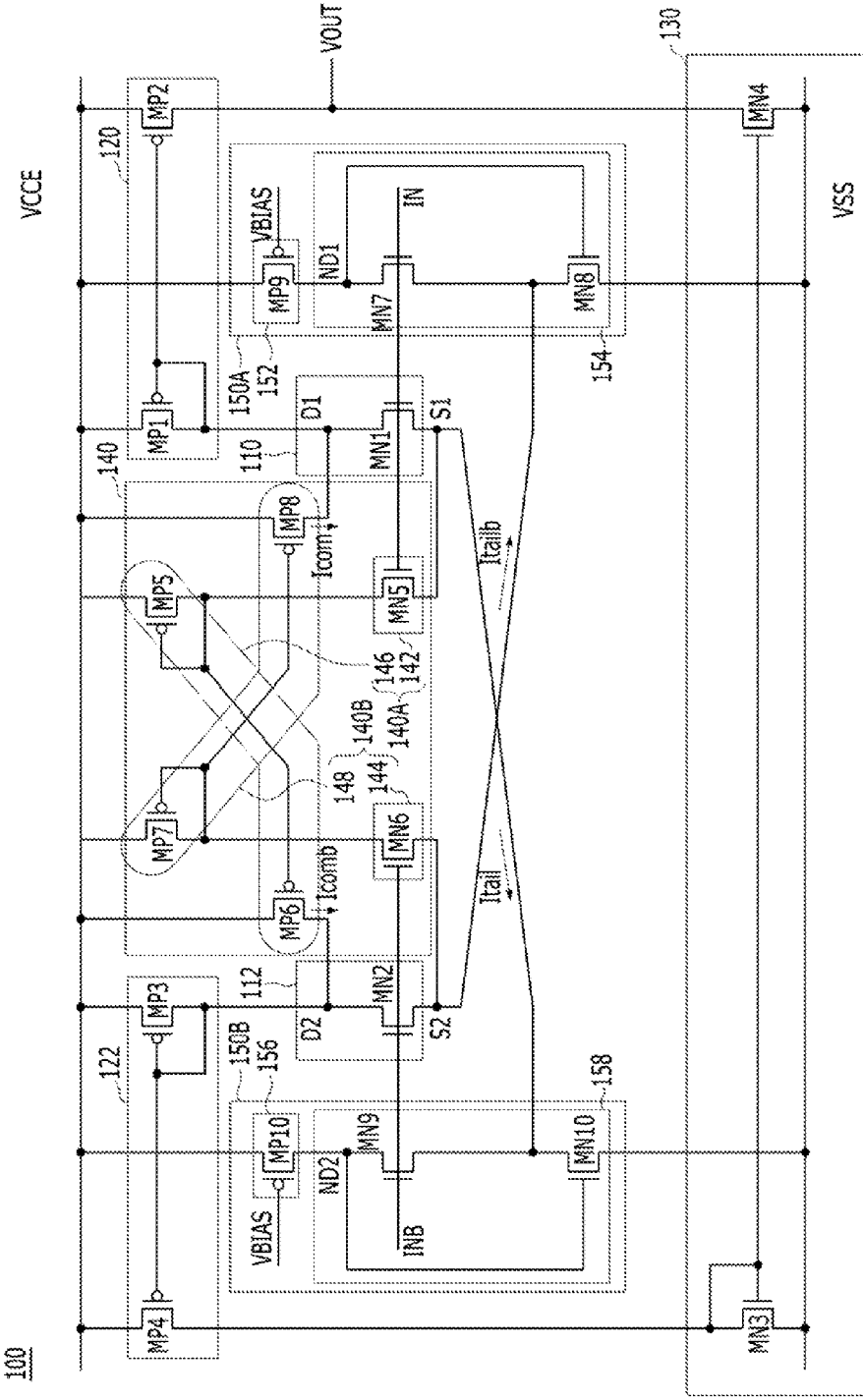
FIG. 2 is a detailed circuit diagram showing the configuration of the differential amplifier of FIG. 1.

FIG. 1 is a schematic block diagram of a differential amplifier 100 in accordance with an embodiment of the present invention. FIG. 2 is a detailed circuit diagram showing the configuration of the differential amplifier 100 of FIG. 1. In FIGS. 1 and 2, the same elements are hereinafter assigned the same reference numerals.

First, referring to FIG. 1, the differential amplifier 100 includes a first main input unit 110, a second main input unit 112, a first current mirroring unit 120, a second current mirroring unit 122, an output unit 130, a first current control unit 140, and a second current control unit 150.

The first main input unit 110 and the second main input unit 120 receive a first input signal IN and a second input signal INB, respectively. The first current mirroring unit 120 is coupled to the first terminal D1 of the first main input unit 110 and configured to mirror the current of the first input signal IN which is inputted to the first main input unit 110. The second current mirroring unit 122 is coupled to the first terminal D2 of the second main input unit 112 and configured to mirror the current of the second input signal INB which is inputted to the second main input unit 112. The output unit 130 generates an output voltage VOUT based on the results of the mirroring of the first current mirroring unit 120 and the second current mirroring unit 122. The first current control unit 140 supplies the first terminal D1 of the first main input unit 110 with a first compensation current Icom generated by re-mirroring the second input signal INB and supplies the first terminal D2 of the second main input unit 112 with a second compensation current Icomb generated by re-mirroring the first input signal IN. The second current control unit 150 controls the tail current Itail of the second terminal S1 of the first main input unit 110 in response to the second input signal INB and controls the tail current Itailb of the second terminal S2 of the second main input unit 112 in response to the first input signal IN.

In an embodiment of the present invention, the first current control unit 140A of the first current control unit 140 can reduce the current of the second input signal INB, which is mirrored by the second current mirroring unit 122, by supplying the second compensation current Icomb to the first terminal D2 of the second main input unit 112. Furthermore, the first current control unit 140B of the first current control unit 140 can reduce the current of the first input signal IN, which is mirrored by the first current mirroring unit 120, by supplying the first compensation current Icom to the first terminal D1 of the first main input unit 110. Accordingly, the quiescent current of the amplifier 100 can be reduced. Furthermore, the second current control unit 150 can adaptively change the tail current of each of the input units of the differential amplifier 100 in response to the first input signal IN and the second input signal INB which are differentially received. Accordingly, the differential amplifier in accordance with an embodiment of the present invention can improve a bandwidth characteristic by reducing the quiescent current (Iq) of a class AB amplifier and at the same time can improve a slew rate characteristic by adaptively changing the tall current because a signal path is diversified. Accordingly, response speed can be enhanced because the bandwidth characteristic is improved and at the same time, the current driving ability can be enhanced because the slew rate characteristic is improved.

More specifically, referring to FIG. 2, the first main input unit 110 may include a first main input transistor MN1 configured to have a gate to which the first input signal IN is inputted. The second main input unit 112 may include a second main input transistor MN2 configured to have a gate to which the second input signal INB is inputted.

The first current mirroring unit 120 may include a first mirror transistor MP1 configured to have a source coupled to a terminal for a power supply voltage VCCE and to have a drain and gate coupled to the drain of the first main input transistor MN1 and a second mirror transistor MP2 configured to have a source coupled to the terminal for the power supply voltage VCCE and to have a gate coupled to the gate of the first mirror transistor MP1. In this case, the size ratio W/L of the first mirror transistor MP1 and the second mirror transistor MP2 may be set as 1:A (A is a natural number). Accordingly, the first current mirroring unit 120 can mirror the current of the first input signal IN, which is inputted to the gate of the first main input transistor MN1.

The second current mirroring unit 122 may include a third mirror transistor MP3 configured to have a source coupled to the terminal for the power supply voltage VCCE and to have a drain and gate coupled to the drain of the second main input transistor MN2 and a fourth mirror transistor MP4 configured to have a source coupled to the terminal for the power supply voltage VCCE and to have a gate coupled to the gate of the third mirror transistor MP3. In this case, the size ratio W/L of the third mirror transistor MP3 and the fourth mirror transistor MP4 may be set as 1:A. Accordingly, the second current mirroring unit 122 can mirror the current of the second input signal INB which is inputted to the gate of the second main input transistor MN2.

The output unit 130 may include a first output transistor MN3 configured to have a gate and drain coupled to the drain of the fourth mirror transistor MP4 and to have a source coupled to a terminal for a ground voltage VSS and a second output transistor MN4 configured to have a drain coupled to the drain of the second mirror transistor MP2 and to have a source coupled to the terminal for the ground voltage terminal. The first output transistor MN3 and the second output transistor MN4 form a current mirror so that the current of the first input signal IN mirrored by the first current mirroring unit 120 and the current of the second input signal INB mirrored by the second current mirroring unit 122 are joined at a terminal for the output voltage VOUT, that is, in the drains of the second mirror transistor MP2 and the second output transistor MN4. Accordingly, the output unit 130 may output the output voltage VOUT through the terminal for the output voltage VOUT based on the results of the mirroring of the first current mirroring unit 120 and the second current mirroring unit 122.

The first current control unit 140 may include a first sub-input unit 142, a second sub-input unit 144, a third current mirroring unit 146, and a fourth current mirroring unit 148.

The first sub-input unit 142 has a first terminal coupled to the second terminal S1 of the first main input unit 110 and receives the first input signal IN. The second sub-input unit 144 has a first terminal coupled to the second terminal S2 of the second main input unit 112 and receives the second input signal INB. The third current mirroring unit 146 is coupled to the second terminal of the first sub-input unit 142 and is configured to generate the second compensation current Icomb by re-mirroring the current of the first input signal IN inputted to the first sub-input unit 142 and to supply the generated second compensation current Icomb to the first terminal D2 of the second main input unit 112. The fourth current mirroring unit 148 is coupled to the second terminal of the second sub-input unit 144 and is configured to generate the first compensation current Icom by re-mirroring the current of the second input signal INB inputted to the second sub-input unit 144 and to supply the generated first compensation current Icom to the first terminal D1 of the first main input unit 110. For reference, the first sub-input unit 142 and third current mirroring unit 146 of FIG. 2 may correspond to the first current control unit 140A of FIG. 1, and the second sub-input unit 144 and fourth current mirroring unit 148 of FIG. 2 may correspond to the first current control unit 140B of FIG. 1.

More specifically, the first sub-input unit 142 may include a first sub-input transistor MN5 configured to have a source coupled to the source of the first main input transistor MN1 and to have a gate to which the first input signal IN is inputted. The second sub-input unit 144 may include a second sub-input transistor MN6 configured to have a source coupled to the source of the second main input transistor MN2 and to have a gate to which the second input signal INB is inputted. In this case, each of the size ratio W/L of the first sub-input transistor MN5 and the first main input transistor MN1 and the size ratio W/L of the second sub-input transistor MN6 and the second main input transistor MN2 may be set to 1:C (C is a natural number greater than B).

Furthermore, the third current mirroring unit 146 may include a fifth mirror transistor MP5 configured to have a source coupled to the terminal for the power supply voltage VCCE and to have a drain and gate coupled to the drain of the first sub-input transistor MN5 and a sixth mirror transistor MP6 configured to have a source coupled to the terminal for the power supply voltage VCCE, a gate coupled to the gate of the fifth mirror transistor MP5, and a drain coupled to the drain of the second main input transistor MN2. In this case, the size ratio W/L of the fifth mirror transistor MP5 and the sixth mirror transistor MP6 may be set to 1:B (B is a natural number). Accordingly, the third current mirroring unit 146 can supply the drain of the second main input transistor MN2 with the second compensation current Icomb generated by re-mirroring the current of the first input signal IN which is inputted to the gate of the first sub-input transistor MN5.

The fourth current mirroring unit 148 may include a seventh mirror transistor MP7 configured to have a source coupled to the terminal for the power supply voltage VCCE and to have a drain and gate coupled to the drain of the second sub-input transistor MN6 and an eighth mirror transistor MP8 configured to have a source coupled to the terminal for the power supply voltage VCCE and to have a gate coupled to the gate of the seventh mirror transistor MP7. In this case, the size ratio W/L of the seventh mirror transistor MP7 and the eighth mirror transistor MP8 may be set to 1:B. Accordingly, the fourth current mirroring unit 148 can supply the drain of the first main input transistor MN1 with the first compensation current Icom generated by re-mirroring the current of the second input signal INB which is inputted to the gate of the second sub-input transistor MN6.

The second current control unit 150 may include a first bias supply unit 152, a first tail current control unit 154, a second bias supply unit 156, and a second tail current control unit 158.

The first bias supply unit 152 is coupled between the terminal for the power supply voltage VCCE and a first node ND1 and turned on in response to a bias signal VBIAS. The first tail current control unit 154 is coupled between the first node ND1 and the terminal for the ground voltage VSS and configured to control the tail current Itailb of the second terminal S2 of the second main input unit 112 in response to the first Input signal IN. The second bias supply unit 156 is coupled between the terminal for the power supply voltage VCCE and a second node ND2 and turned on in response to the bias signal VBIAS. The second tail current control unit 158 is coupled between the second node ND2 and the terminal for the ground voltage VSS and configured to control the tail current Itail of the second terminal S1 of the first main input unit 110 in response to the second input signal INB.

More specifically, the first bias supply unit 152 may include a first bias transistor MP9 configured to have a source-drain path coupled between the terminal for the power supply voltage VCCE and the first node ND1 and to have a gate to which the bias signal VBIAS is inputted. The second bias supply unit 156 may include a second bias transistor MP10 configured to have a source-drain path coupled between the terminal for the power supply voltage VCCE and the second node ND2 and to have a gate to which the bias signal VBIAS is inputted.

The first tail current control unit 154 may include a third sub-input unit MN7 coupled between the first node ND1 and the second terminal S2 of the second main input unit 112 and configured to receive the first input signal IN and a first diode unit MN8 coupled between the second terminal S2 of the second main input unit 112 and the terminal for the ground voltage VSS and turned on in response to the voltage of the first node ND1. In this case, the third sub-input unit MN7 may include a third sub-input transistor MN7 configured to have a source-drain path coupled between the first node ND1 and the source of the second main input transistor MN2 and to have a gate to which the first input signal IN is inputted. The first diode unit MN8 may include a first current sink transistor MN8 configured to have a source-drain path coupled between the source of the second main input transistor MN2 and the terminal for the ground voltage VSS and to have a gate to which the voltage of the first node ND1 is inputted. That is, the first tail current control unit 154 can variably control the tail current Itailb of the second main input transistor MN2 by forming a current sink path from the source of the second main Input transistor MN2 to the terminal for the ground voltage VSS in response to the first input signal IN.

The second tail current control unit 158 may include a fourth sub-input unit MN9 coupled between the second node ND2 and the second terminal S1 of the first main input unit 110 and to receive the second input signal INB and a second diode unit MN10 coupled between the second terminal S1 of the first main input unit 110 and the terminal for the ground voltage VSS and turned on in response to the voltage of the second node ND2. In this case, the fourth sub-input unit MN9 may include a fourth sub-input transistor MN9 configured to have a source-drain path coupled between the second node ND2 and the source of the first main input transistor MN1 and to have a gate to which the second input signal INB is inputted. The second diode unit MN10 may include a second current sink transistor MN10 configured to have a source-drain path coupled between the source of the first main input transistor MN1 and the terminal for the ground voltage VSS and to have a gate to which the voltage of the second node ND2 is inputted. That is, the second tail current control unit 158 can variably control the tail current Itail of the first main input transistor MN1 by forming a current sink path from the source of the first main input transistor MN1 to the terminal for the ground voltage VSS in response to the second input signal INB.

The operations of the first current control unit 140 and the second current control unit 150 are described below with reference to FIGS. 3 and 4. An example in which the first current control unit 140 and the second current control unit 150 are included in respective amplifiers is described below, for convenience of description.

Figure 3:
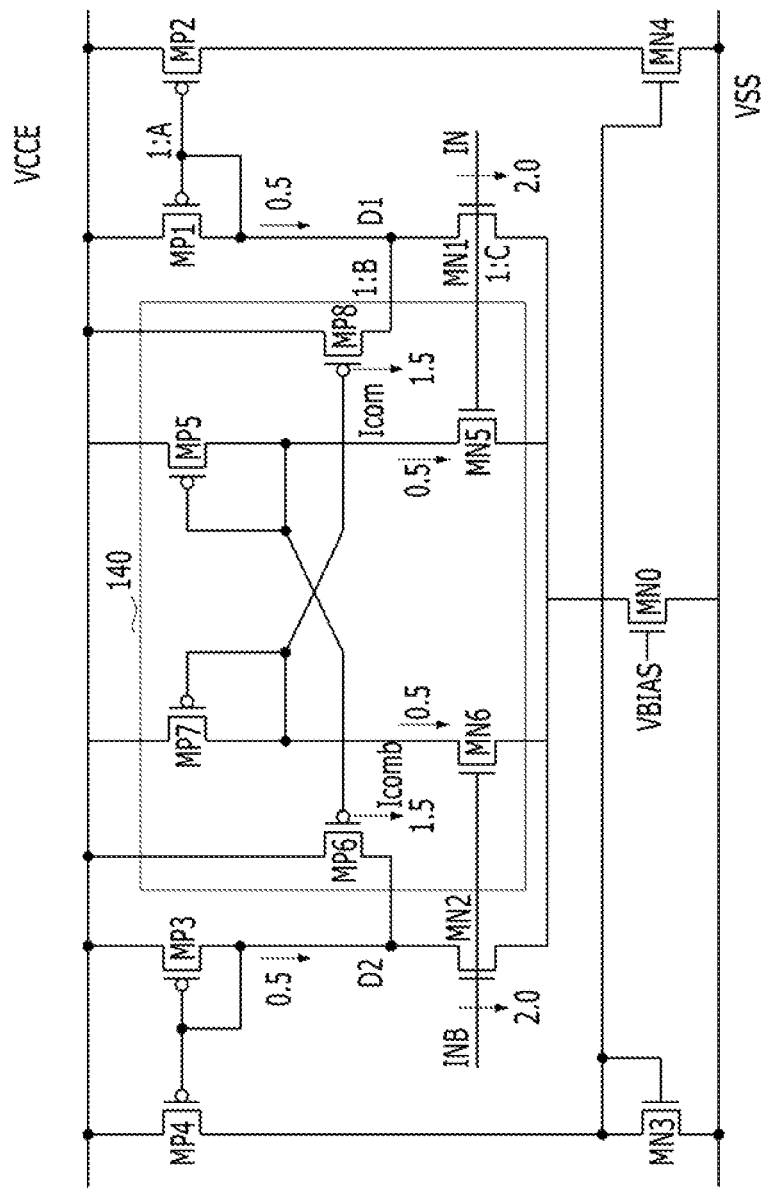
FIG. 3 is a circuit diagram of a first current control unit of FIG. 2.

FIG. 3 is a circuit diagram of the first current control unit 140 of FIG. 2. For reference, a transistor MN0 shown in FIG. 3 is a bias transistor MN0 configured to supply a bias to the differential amplifier.

FIG. 3 illustrates an example in which the first input signal IN and the second input signal INB having the same amount of current (e.g., 2.0) are respectively inputted to the first main input transistor MN1 and first main input transistor MN1 of the amplifier. FIG. 3 illustrates an example in which A=5, B=3, and C=4 assuming that each of the size ratio W/L of the first mirror transistor MP1 and the second mirror transistor MP2 and the size ratio W/L of the third mirror transistor MP3 and the fourth mirror transistor MP4 is set to 1:A, each of the size ratio W/L of the fifth mirror transistor MP5 and the sixth mirror transistor MP6 and the size ratio W/L of the seventh mirror transistor MP7 and the eighth mirror transistor MP8 is set to 1:B, and each of the size ratio W/L of the first sub-input transistor MN5 and the first main input transistor MN1 and the size ratio W/L of the second sub-input transistor MN6 and the second main input transistor MN2 is set to 1:C.

In this case, since the size ratio W/L of the first sub-input transistor MN5 and the first main input transistor MN1 is 1:4, if the amount of current of the first input signal IN flowing into the first main input transistor MN1 is 2.0, the amount of current of the first input signal IN flowing into the first sub-input transistor MN5 is 0.5. Furthermore, since the size ratio W/L of the second sub-input transistor MN6 and the second main input transistor MN2 is 1:4, if the amount of current of the second input signal INB flowing into the second main input transistor MN2 is 2.0, the amount of current of the second input signal INB flowing into the second sub-input transistor MN6 is 0.5.

The seventh mirror transistor MP7 and the eighth mirror transistor MP8 forming the fourth current mirroring unit (148 of FIG. 2) generate the first compensation current Icom by re-mirroring the amount of current "0.5" of the second input signal INB which flows into the second sub-input transistor MN6. In this case, the amount of current of the first compensation current Icom flowing into the eighth mirror transistor MP8 becomes 1.5 because the size ratio W/L of the seventh mirror transistor MP7 and the eighth mirror transistor MP8 has been set to 1:3. Accordingly, the amount of current flowing into the first mirror transistor MP1 becomes 0.5 smaller than the existing amount of current "2.0" of the first input signal IN which flows into the first main input transistor MN1. Likewise, the amount of current flowing into the third mirror transistor MP3 becomes 0.5 smaller than the existing amount of current "2.0" of the second input signal INB which is inputted to the second main input transistor MN2.

As a result, the differential amplifier in accordance with an embodiment of the present invention can reduce total consumption power by reducing the quiescent current (Iq) of a class AB amplifier. Accordingly, the differential amplifier can improve a bandwidth characteristic and also enhance response speed through the improved bandwidth characteristic.

Figure 4:
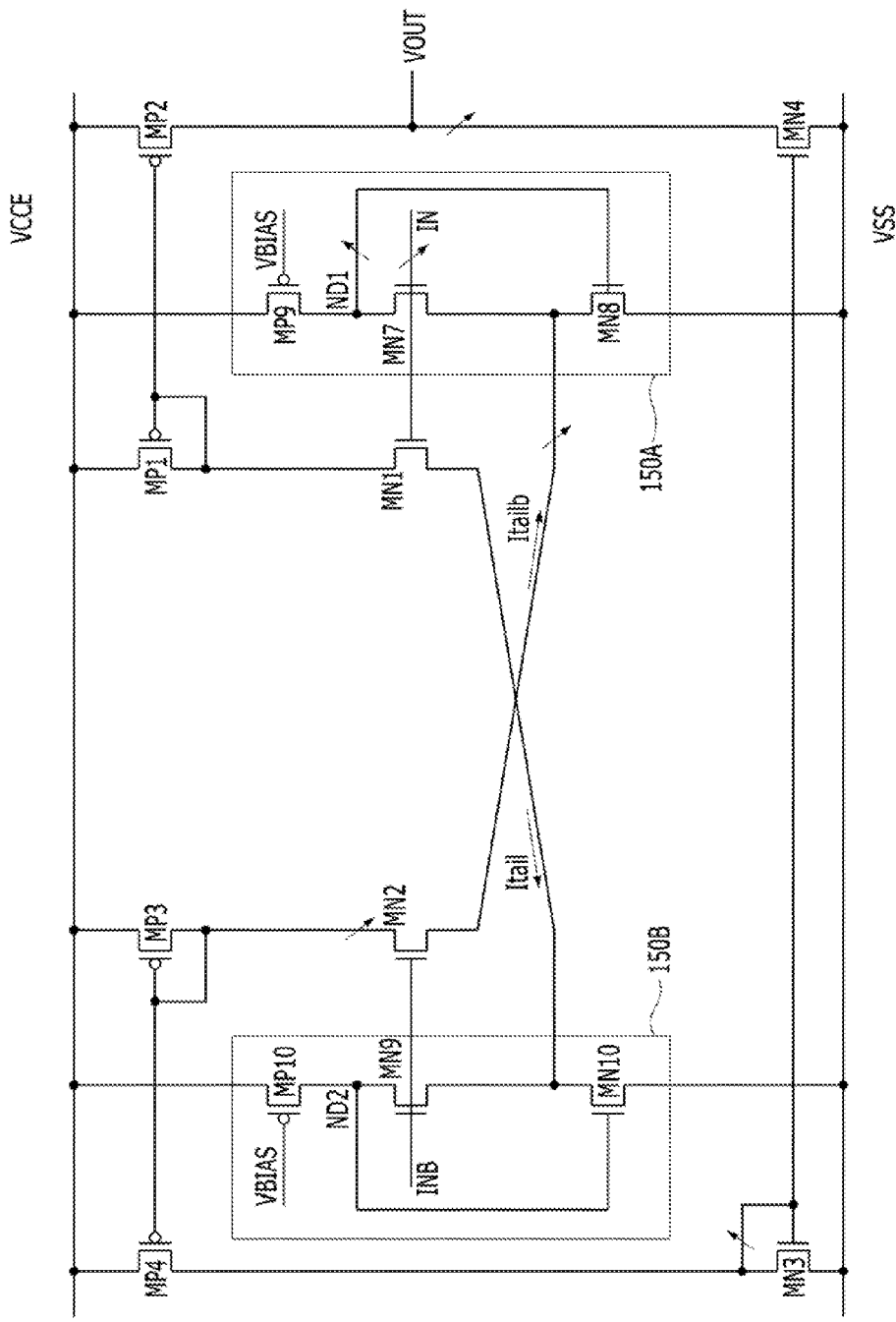
FIG. 4 is a circuit diagram of a second current control unit of FIG. 2.

FIG. 4 is a circuit diagram of the second current control unit 150 of FIG. 2.

FIG. 4 illustrates an example in which the amount of current of the first input signal IN inputted to the third sub-input transistor MN7 is smaller than that of the second input signal INB. In this case, the voltage of the first node ND1 is increased, and thus the first current sink transistor MN8 is strongly turned on. Accordingly, the tail current Itailb of the second main input transistor MN2 is increased because a current sink path from the source of the second main input transistor MN2 to the terminal for the ground voltage VSS is strongly formed. That is, when the amount of current of the first input signal IN is smaller than that of the second input signal INB, the tail current Itailb of the second main input transistor MN2 is increased. At this time, when the tail current Itailb of the second main input transistor MN2 is increased, the third mirror transistor MP3 and the fourth mirror transistor MP4 are turned on, and thus the first output transistor MN3 and the second output transistor MN4 are also turned on. As a result, the level of the output voltage VOUT is lowered.

When the amount of current of the second input signal INB is smaller than that of the first input signal IN, however, the tall current Itail of the first main input transistor MN1 is increased. Accordingly, the first mirror transistor MP1 and the second mirror transistor MP2 are turned on, and thus the level of the output voltage VOUT is increased.

As described above, the differential amplifier in accordance with an embodiment of the present invention can improve a slew rate characteristic by adaptively changing the tail current in response to the first input signal IN and the second input signal INB which are differentially inputted.

Figure 5:
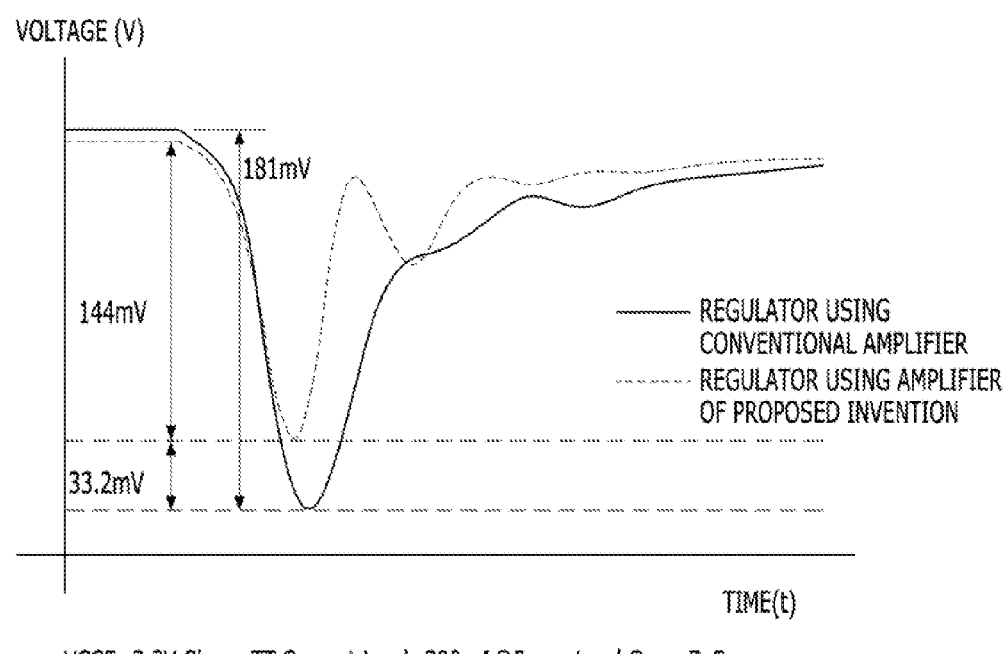
FIG. 5 is a timing diagram illustrating the LDO characteristics of an LDO voltage regulator adopting a conventional differential amplifier and an LDO voltage regulator adopting the differential amplifier in accordance with an embodiment of the present invention.

FIG. 5 is a timing diagram illustrating the LDO characteristics of an LDO voltage regulator adopting a conventional differential amplifier and an LDO voltage regulator adopting the differential amplifier in accordance with an embodiment of the present invention.

FIG. 5 illustrates an example in which the amount of a voltage drop was reduced about 35 mV in the case of the LDO voltage regulator adopting the differential amplifier in accordance with an embodiment of the present invention compared to the LDO voltage regulator adopting the conventional differential amplifier. That is, the quiescent current (Iq) of a class AB amplifier can be reduced because the first current control unit 140 diversifies a signal path, and the second current control unit 150 can adaptively change the tail current of each of the input units of the differential amplifier 100 in response to the first input signal IN and the second input signal INB which are differentially inputted. Accordingly, the differential amplifier in accordance with an embodiment of the present invention can enhance response speed according to an improved bandwidth characteristic and can also improve the current driving ability according to an improved slew rate characteristic. As a result, it may be seen that an LDO characteristic has been improved.

Figure 6:
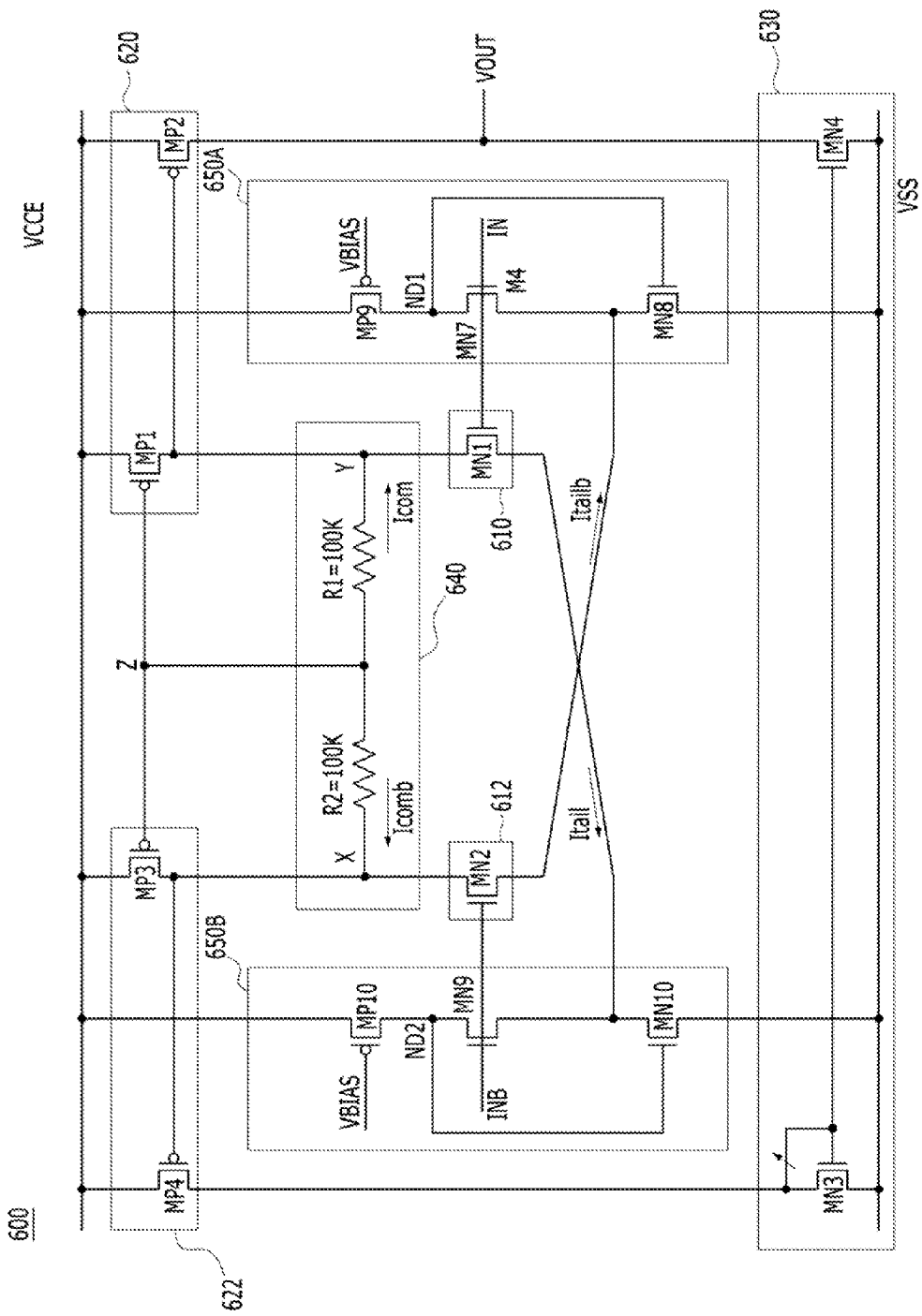
FIG. 6 is a detailed circuit diagram of a differential amplifier in accordance with another embodiment of the present invention.

FIG. 6 is a detailed circuit diagram of a differential amplifier 600 in accordance with another embodiment of the present invention. The same elements as those of the differential amplifier 100 of FIG. 2 are hereinafter assigned the same reference numerals.

Referring to FIG. 6, the differential amplifier 600 includes a first main input unit 610, a second main input unit 612, a first current mirroring unit 620, a second current mirroring unit 622, an output unit 630, a first current control unit 640, and second current control units 650A and 650B. For reference, in the elements of the differential amplifier 600 of FIG. 6, the first current control unit 640 has a configuration different from that of the first current control unit 140 of FIG. 2, and thus the configurations of the first current mirroring unit 620 and the second current mirroring unit 622 are changed.

First, the first current mirroring unit 620 of the differential amplifier 600 includes a first mirror transistor MP1 configured to have a source-drain path coupled between a terminal for a power supply voltage VCCE and the drain (i.e., the node Y) of a first main input transistor MN1 and a second mirror transistor MN2 configured to have a source-drain path coupled between the terminal for the power supply voltage VCCE and a terminal for an output voltage VOUT and to have a gate coupled to the drain (i.e., the node Y) of the first mirror transistor MN1.

The second current mirroring unit 622 includes a third mirror transistor MP3 configured to have a source-drain path coupled to the terminal for the power supply voltage VCCE and the drain (i.e., the node X) of the second main input transistor MN2 and to have a gate coupled to the gate (i.e., the node Z) of the first mirror transistor MN1 and a fourth mirror transistor MP4 configured to have a source-drain path coupled between the terminal for the power supply voltage VCCE and the output unit 630 and to have a gate coupled to the drain (i.e., the node X) of the third mirror transistor MP3.

The first current control unit 640 includes a first resistor R1 coupled between the drain (i.e., the node Y) and gate (i.e., node Z) of the first mirror transistor MP1 and a second resistor R2 coupled between the drain (i.e., the node X) and gate (i.e., node Z) of the third mirror transistor MP3. In this case, a ratio of the first resistor R1 and the second resistor R2 may be set to 1:1.

The first current control unit 640 of the differential amplifier 600 configured as described above can reduce the amount of current flowing into the third mirror transistor MP3 by supplying the drain of the second main input transistor MN2 with the second compensation current Icomb generated in response to the first input signal IN and can reduce the amount of current flowing into the first mirror transistor MP1 by supplying the drain of the first main input transistor MN1 with the first compensation current Icom generated in response to the second input signal INB. As a result, the quiescent current (Iq) of the differential amplifier 600 can be reduced.

Figure 7:
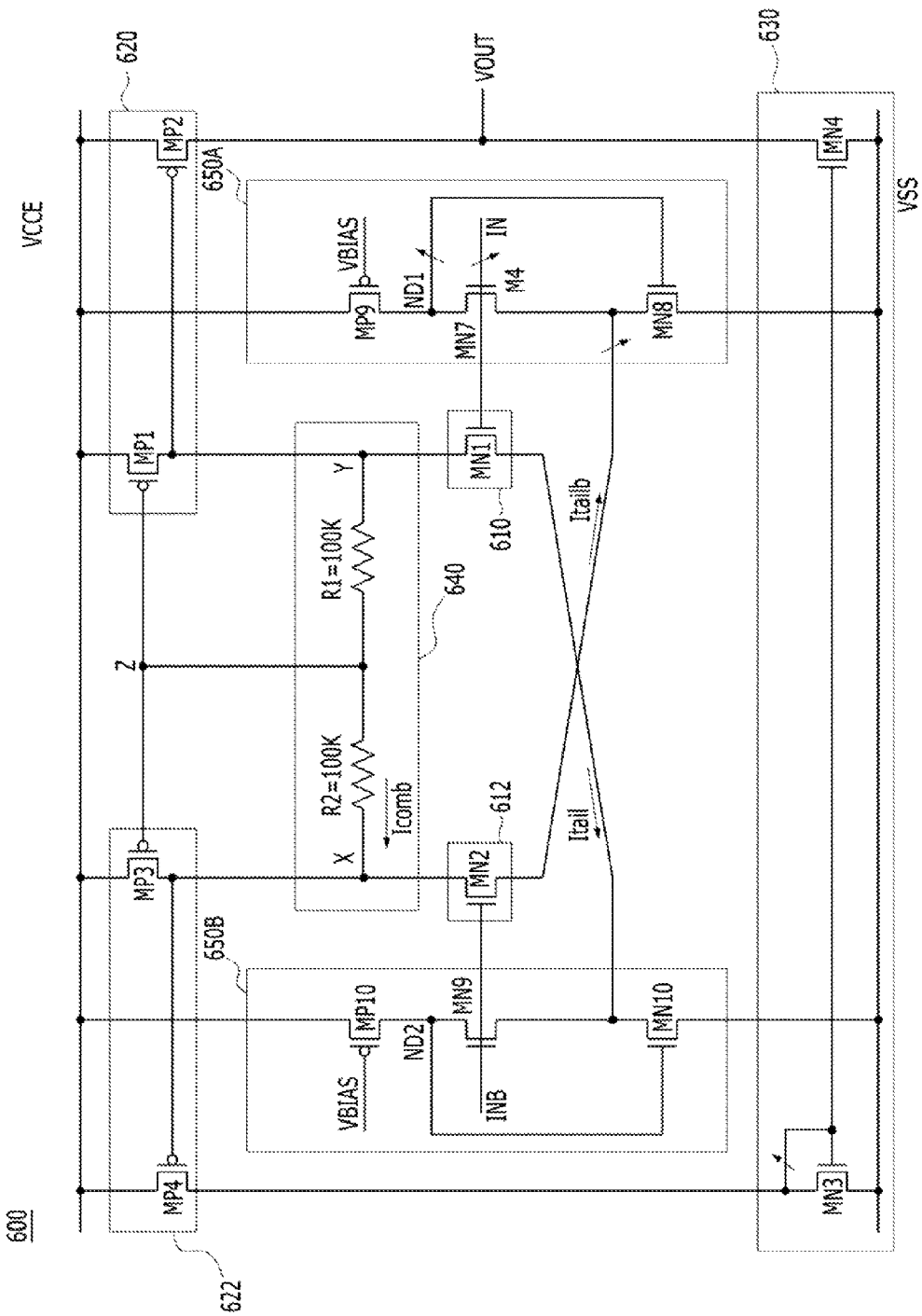
FIG. 7 is a circuit diagram illustrating the operation of the differential amplifier of FIG. 6.

FIG. 7 is a circuit diagram illustrating the operation of the differential amplifier 600 of FIG. 6.

FIG. 7 illustrates an example in which the amount of current of the first input signal IN inputted to the first main input unit MN1 and the third sub-input transistor MN7 is smaller than that of the second input signal INB. In this case, the voltage of the first node ND1 is increased, and thus the first current sink transistor MN8 is strongly turned on. Accordingly, the tail current Itailb of the second main input transistor MN2 is increased because a current sink path from the source of the second main input transistor MN2 to the terminal for the ground voltage VSS is strongly formed. That is, when the amount of current of the first input signal IN is smaller than that of the second input signal INB, the tail current Itailb of the second main input transistor MN2 is increased. At this time, when the tail current Itailb of the second main input transistor MN2 is increased, the voltage level of the node X drops. Accordingly, the second compensation current Icomb is generated and supplied to the drain of the second main input transistor MN2. As a result, the quiescent current of the differential amplifier 600 can be reduced because the amount of current flowing into the third mirror transistor MP3 is reduced.

When the amount of current of the first input signal IN Inputted to the second main Input unit MN2 and the fourth sub-input transistor MN9 is smaller than that of the second input signal INB, however, the tail current Itail of the first main input transistor MN1 is increased. At this time, when the tail current Itail of the first main input transistor MN1 is increased, the voltage level of the node Y drops. Accordingly, the first compensation current Icom is generated and supplied to the drain of the first main Input transistor MN1. As a result, the quiescent current of the differential amplifier 600 can be reduced because the amount of current flowing into the first mirror transistor MP1 is reduced.

Figure 8:
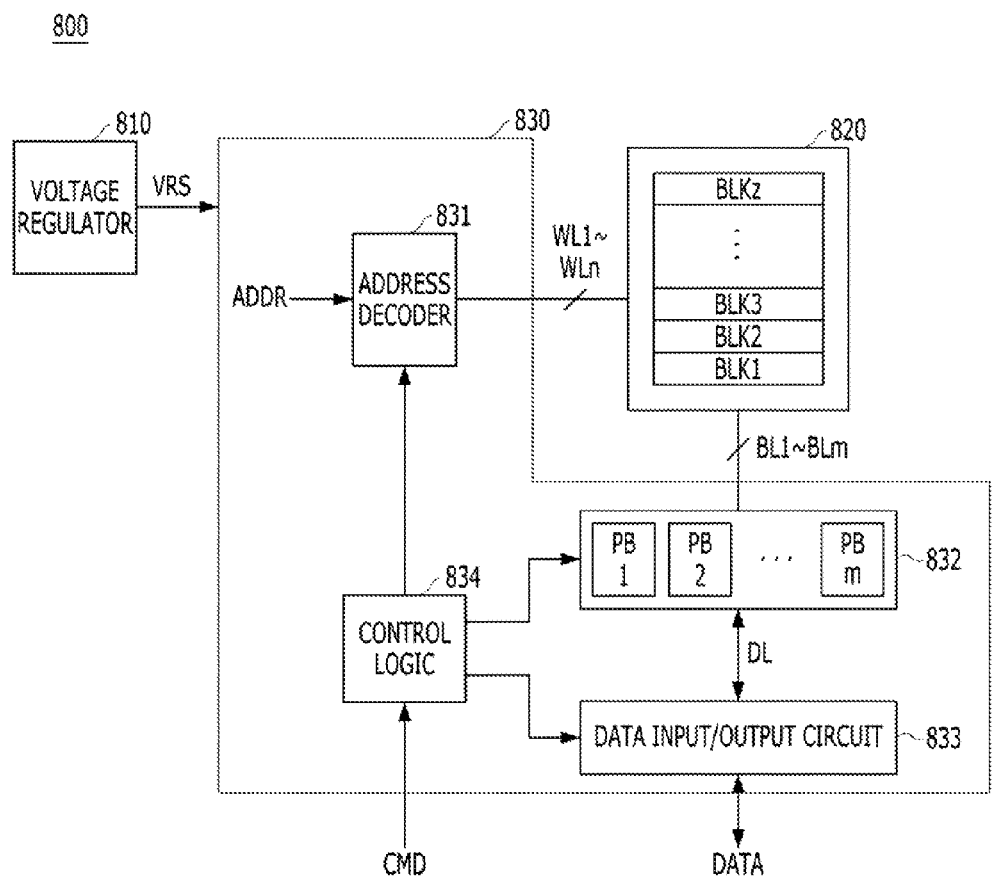
FIG. 8 is a block diagram of a semiconductor memory device in accordance with an embodiment of the present invention.

FIG. 8 is a block diagram of a semiconductor memory device 800 in accordance with an embodiment of the present invention.

Referring to FIG. 8, the semiconductor memory device 800 includes a memory cell array 820, a peripheral circuit 830, and a voltage regulator 810. The peripheral circuit 830 may include an address decoder 831, a read/write circuit 832, a data input/output circuit 833, and control logic 834.

The memory cell array 820 is coupled to the address decoder 831 through word lines WL1~WLn and coupled to the read/write circuit 832 through bit lines BL1~BLm. The memory cell array 820 includes a plurality of memory blocks BLK1~BLKz. The plurality of memory blocks BLK1~BLKz includes a plurality of memory cells. Memory cells that belong to the plurality of memory cells and that are disposed in a row direction are coupled to the word lines WL1~WLn. Memory cells that belong to the plurality of memory cells and that are disposed in a column direction are coupled to the bit lines BL1~BLm. Each of the plurality of memory cells may operate as a single level cell (SLC) or a multi-level cell (MLC). In an embodiment, the plurality of memory cells is nonvolatile memory cells.

The address decoder 831 is coupled to the memory cell array 820 through the word lines WL1~WLn. The address decoder 831 is configured to operate in response to control of the control logic 834. The address decoder 831 receives an external address ADDR.

The address decoder 831 generates a block address by decoding the address ADDR and selects one of the plurality of memory blocks BLK1~BLKz of the memory cell array 820 in response to the generated block address. The address decoder 831 generates a row address by decoding the address ADDR and selects one of the word lines WL1~WLn coupled to a selected memory block in response to the generated row address. The address decoder 831 may include a block decoder, a row decoder, and an address buffer.

The read/write circuit 832 is coupled to the memory cell array 820 through the bit lines BL1~BLm and coupled to the data input/output circuit 833 through data lines DL. The read/write circuit 832 operates in response to control of the control logic 834.

When a program operation is performed, the read/write circuit 832 receives program data DATA from the data input/output circuit 833 and transfers the program data DATA to the bit lines BL1~BLm. The transferred data is programmed into memory cells coupled to a selected word line. When a read operation is performed, the read/write circuit 832 reads the data of memory cells coupled to a selected word line through the bit lines BL1~BLm and outputs the read data DATA to the data input/output circuit 833 through the data lines DL. When an erase operation is performed, the read/write circuit 832 may make the bit lines BL1~BLm floated. In an embodiment, the read/write circuit 832 may include page buffers PB~PBm corresponding to the respective bit lines and a column selection circuit (not shown).

The data input/output circuit 833 is coupled to the read/write circuit 832 through the data lines DL. The data input/output circuit 833 operates in response to control of the control logic 834. The data input/output circuit 833 sends and receives data DATA to and from the outside. When a program operation is performed, the data input/output circuit 833 receives program data DATA from the outside and sends the program data DATA to the read/write circuit 832. When a read operation is performed, the data input/output circuit 833 receives read data DATA from the read/write circuit 832 and outputs the read data DATA to the outside.

The control logic 834 is coupled to the address decoder 831, the read/write circuit 832, and the data input/output circuit 833. The control logic 834 may be configured to receive a command CMD through the input/output buffer (not shown) of the semiconductor memory device 800 and to control an overall operation of the semiconductor memory device 800 in response to the command.

The voltage regulator 810 may supply a constant voltage to each of the elements of the peripheral circuit 830. FIG. 8 illustrates that the voltage regulator 810 supplies a supply voltage VRS to the peripheral circuit 830, but the voltage regulator 810 may supply a required voltage to each of the address decoder 831, read/write circuit 832, data input/output circuit 833, and control logic 834 of the peripheral circuit 830.

While the semiconductor memory device 800 operates, the supply voltage VRS may temporarily vary depending on the operation of an element coupled to the output terminal of the voltage regulator 810. For example, if an electric current flowing from the output terminal of the voltage regulator 810 temporarily rises, the supply voltage VRS of the voltage regulator 810 may temporarily drop. A known voltage regulator 810 detects a voltage drop of the output terminal and recovers the supply voltage VRS by turning on a driving transistor coupled to an external voltage. At this time, the supply voltage VRS needs to be rapidly recovered when a voltage drop is generated for the stable operation of the semiconductor memory device 800.

The voltage regulator 810 in accordance with an embodiment of the present invention may include a differential amplifier (910 of FIG. 9) capable of rapidly recovering an output voltage when the output voltage varies due to a change of a load current. In this case, the differential amplifier included in the voltage regulator 810 may have the configuration described with reference to FIGS. 1 to 7. That is, the differential amplifier included in the voltage regulator 810 is configured to reduce the quiescent current (Iq) of a class AB amplifier and to adaptively change a tail current at the same time.

Figure 9:
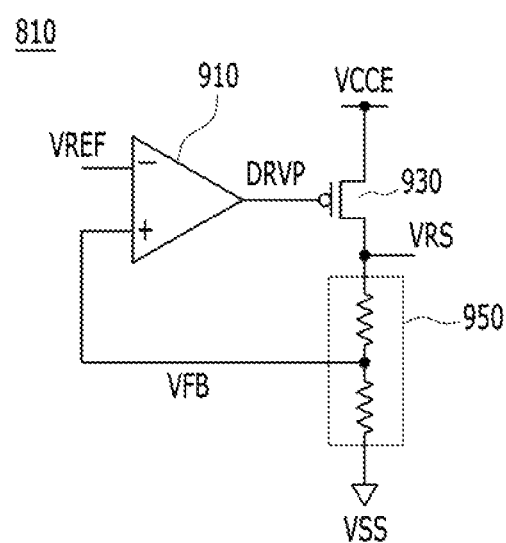
FIG. 9 is a detailed circuit diagram showing the configuration of a voltage regulator of FIG. 8.

FIG. 9 is a detailed circuit diagram showing the configuration of the voltage regulator 810 of FIG. 8.

Referring to FIG. 9, the voltage regulator 810 includes a differential amplifier 910, a driving transistor 930, and a voltage distribution circuit 950.

The differential amplifier 930 may have the configuration described with reference to FIGS. 1 to 7. That is, the differential amplifier 930 may include the first and the second main input units configured to receive a positive input signal through a positive input terminal and a negative input signal through a negative input terminal, respectively, the first current mirroring unit coupled to the first terminal of the first main input unit and configured to mirror the current of the positive input signal inputted to the first main input unit, the second current mirroring unit coupled to the first terminal of the second main input unit and configured to mirror the current of the negative input signal inputted to the second main input unit, the output unit configured to generate an output voltage DRVP based on the results of the mirroring of the first current mirroring unit and the second current mirroring unit, the first current control unit configured to reduce a current mirrored by the first current mirroring unit by supplying the first terminal of the first main input unit with the first compensation current generated by re-mirroring the negative input signal and to reduce a current mirrored by the first current mirroring unit by supplying the first terminal of the second main input unit with the second compensation current generated by re-mirroring the positive input signal, and the second current control unit configured to control the tail current of the first main Input unit in response to the negative input signal and to control the tail current of the second main input unit in response to the positive input signal.

The driving transistor 930 is turned on in response to the output voltage DRVP of the differential amplifier 910, thus outputting the external power supply voltage VCCE as the supply voltage VRS. The voltage distribution circuit 950 outputs a feedback voltage VFB, generated by distributing the supply voltage VRS, to the positive input terminal of the differential amplifier 910. For reference, the feedback voltage VFB generated by the voltage distribution circuit 950 may be inputted to the positive input terminal of the differential amplifier 910, and a reference voltage VREF may be inputted to the negative input terminal of the differential amplifier 910.

FIGS. 8 and 9 illustrate an example in which the differential amplifier in accordance with an embodiment of the present invention has been implemented as the voltage regulator of a semiconductor memory device, but the differential amplifier in accordance with an embodiment of the present invention may be implemented as other various circuits, for example, a unit gain buffer.

As described above, in accordance with an embodiment of the present invention, the differential amplifier can reduce a current flowing through the current mirroring unit for mirroring the positive input signal IN and a current flowing through the current mirroring unit for mirroring the negative input signal INB by supplying the positive input terminal with the first compensation current Icom generated in response to the negative input signal INB and supplying the negative input terminal with the second compensation current Icomb generated in response to the positive input signal IN. Accordingly, the quiescent current of the differential amplifier can be reduced. Furthermore, in accordance with an embodiment of the present invention, the differential amplifier can adaptively change the tail current of the negative input terminal and the tall current of the positive input terminal in response to the positive input signal IN and the negative input signal INB, respectively, which are differentially inputted. Accordingly, the differential amplifier in accordance with an embodiment of the present invention can improve a bandwidth characteristic by reducing the quiescent current (Iq) of a class AB amplifier and can also improve a slew rate characteristic by adaptively changing the tail current. Accordingly, response speed can be enhanced according to the improved bandwidth characteristic, and the current driving ability can be enhanced according to the improved slew rate characteristic.

For example, the positions and types of the logic gates and transistors illustrated in the aforementioned embodiments may have been differently implemented depending on the polarity of an input signal.

The differential amplifier circuit in accordance with a proposed embodiment has an advantage in that it can improve a voltage drop characteristic attributable to a load current by enhancing response speed.

Furthermore, the differential amplifier circuit in accordance with a proposed embodiment can improve a bandwidth characteristic by reducing the quiescent current (Iq) of a class AB amplifier and also improve a slew rate characteristic by adaptively changing a tail current because a signal path is diversified. Accordingly, response speed can be enhanced by an Improved bandwidth characteristic, and the current driving ability can be also enhanced by an improved slew rate characteristic.

Although various embodiments have been described for illustrative purposes, it will be apparent to those skilled in the art that various changes and modifications may be made without departing from the spirit and scope of the invention as defined in the following claims.

What is claimed is:

1. A differential amplifier circuit comprising:
    first and second main Input units suitable for receiving a first input signal and a second input signal, respectively;
    a first current mirroring unit suitable for being coupled to a first terminal of the first main input unit and mirroring a current of the first input signal inputted to the first main input unit;
    a second current mirroring unit suitable for being coupled to a first terminal of the second main input unit and mirroring a current of the second input signal inputted to the second main input unit;
    an output unit suitable for generating an output voltage based on results of the mirroring of the first current mirroring unit and the second current mirroring unit;
    a first current control unit suitable for reducing a current mirrored by the first current mirroring unit by supplying the first terminal of the first main input unit with a first compensation current generated by re-mirroring the second input signal and reducing a current mirrored by the second current mirroring unit by supplying the first terminal of the second main input unit with a second compensation current generated by re-mirroring the first input signal; and
    a second current control unit suitable for controlling a tail current of the first main input unit in response to the second input signal and controlling a tail current of the second main input unit in response to the first input signal.

2. The differential amplifier circuit of claim 1, wherein the first current control unit comprises:
    a first sub-input unit suitable for having a first terminal coupled to a second terminal of the first main input unit and receiving the first input signal;
    a second sub-input unit suitable for having a first terminal coupled to a second terminal of the second main input unit and receiving the second input signal;
    a third current mirroring unit suitable for being coupled to a second terminal of the first sub-input unit and supplying the first terminal of the second main input unit with the second compensation current generated by re-mirroring the current of the first Input signal inputted to the first sub-input unit; and
    a fourth current mirroring unit suitable for being coupled to a second terminal of the second sub-input unit and supplying the first terminal of the first main input unit with the first compensation current generated by re-mirroring the current of the second input signal inputted to the second sub-input unit.

3. The differential amplifier circuit of claim 1, wherein the second current control unit comprises:
    a first bias supply unit suitable for being coupled between a power supply voltage terminal and a first node and being turned on in response to a bias signal;
    a first tail current control unit suitable for being coupled between the first node and a ground voltage terminal and controlling the tail current of the second main input unit in response to the first input signal;
    a second bias supply unit suitable for being coupled between the power supply voltage terminal and a second node and being turned on in response to the bias signal; and
    a second tail current control unit suitable for being coupled between the second node and the ground voltage terminal and controlling the tail current of the first main input unit in response to the second input signal.

4. The differential amplifier circuit of claim 3, wherein the first tail current control unit comprises:
    a third sub-input unit suitable for being coupled between the first node and a second terminal of the second main input unit and receiving the first input signal; and
    a first diode unit suitable for being coupled between a second terminal of the second main input unit and the ground voltage terminal and being turned on in response to a voltage of the first node.

5. The differential amplifier circuit of claim 4, wherein the first diode unit comprises a current sink.

6. The differential amplifier circuit of claim 3, wherein the second tail current control unit comprises:
    a fourth sub-input unit suitable for being coupled between the second node and a second terminal of the first main input unit and receiving the second input signal; and
    a second diode unit suitable for being coupled between the second terminal of the first main input unit and the ground voltage terminal and being turned on in response to a voltage of the second node.

7. The differential amplifier circuit of claim 6, wherein the second diode unit comprises a current sink.

8. The differential amplifier circuit of claim 1, wherein the output unit is suitable for:

re-mirroring the current of the second input signal mirrored by the second current mirroring unit, and
generating the output voltage by adding the re-mirrored current of the second input signal to the current of the first input signal mirrored by the first current mirroring unit.

9. A differential amplifier circuit comprising:
first and second main input transistors suitable for having gates to which a first input signal and a second input signal are respectively inputted;
a first current mirroring unit suitable for being coupled to a drain of the first main input transistor and mirroring a current of the first input signal inputted to the gate of the first main input transistor;
a second current mirroring unit suitable for being coupled to a drain of the second main input transistor and mirroring a current of the second input signal inputted to the gate of the second main Input transistor;
an output unit suitable for generating an output voltage based on results of the mirroring of the first current mirroring unit and the second current mirroring unit;
a first current control unit suitable for supplying the drain of the first main input transistor with a first compensation current generated in response to the second input signal and supplying the drain of the second main input transistor with a second compensation current generated in response to the first Input signal; and
a second current control unit suitable for controlling a tail current of the first main input transistor in response to the second input signal and controlling a tail current of the second main input transistor in response to the first input signal.

10. The differential amplifier circuit of claim 9, wherein:
the first compensation current supplied to the drain of the first main input transistor reduces the current of the first input signal mirrored by the first current mirroring unit so that a quiescent current of the differential amplifier circuit is reduced, and
the second compensation current supplied to the drain of the second main input transistor reduces the current of the second input signal mirrored by the second current mirroring unit so that the quiescent current of the differential amplifier circuit is reduced.

11. The differential amplifier circuit of claim 9, wherein the first current control unit is suitable for:
generating the first compensation current by re-mirroring the second input signal, and
generating the second compensation current by re-mirroring the first input signal.

12. The differential amplifier circuit of claim 9, wherein the first current control unit comprises:
a first sub-input transistor suitable for having a source coupled to a source of the first main input transistor and having a gate to which the first input signal is inputted;
a second sub-input transistor suitable for having a source coupled to a source of the second main input transistor and having a gate to which the second input signal is inputted;
a third current mirroring unit suitable for being coupled to a drain of the first sub-input transistor and supplying the second compensation current to a drain of the second main input transistor by re-mirroring the current of the first input signal inputted to the gate of the first sub-input transistor; and
a fourth current mirroring unit suitable for being coupled to a drain of the second sub-input transistor and supplying the first compensation current to a drain of the first main input transistor by re-mirroring the current of the second input signal inputted to the gate of the second sub-input transistor.

13. The differential amplifier circuit of claim 12, wherein:
the third current mirroring unit is suitable for re-mirroring the current of the first input signal and the second compensation current at a ratio of 1:B, and
the fourth current mirroring unit is suitable for re-mirroring the current of the second input signal and the first compensation current at a ratio of 1:B (B is a natural number).

14. The differential amplifier circuit of claim 13, wherein each of a size ratio W/L of the first sub-input transistor and the first main input transistor and a size ratio W/L of the second sub-input transistor and the second main input transistor is set to 1:C (C is a natural number smaller than B).

15. The differential amplifier circuit of claim 9, wherein:
the first current mirroring unit comprises a first mirror transistor suitable for having a source-drain path coupled between a power supply voltage terminal and the drain of the first main input transistor and a second mirror transistor suitable for having a source-drain path coupled between the power supply voltage terminal and a terminal for the output voltage and having a gate coupled to the drain of the first mirror transistor,
the second current mirroring unit comprises a third mirror transistor suitable for having a source-drain path coupled to the power supply voltage terminal and the drain of the second main input transistor and having a gate coupled to a gate of the first mirror transistor and a fourth mirror transistor suitable for having a source-drain path coupled between the power supply voltage terminal and the output unit and having a gate coupled to the drain of the third mirror transistor; and
the first current control unit comprises a first resistor suitable for being coupled between the drain and gate of the first mirror transistor and a second resistor suitable for being coupled between the drain and gate of the third mirror transistor.

16. The differential amplifier circuit of claim 15, wherein the first resistor and the second resistor have an identical resistance value.

17. The differential amplifier circuit of claim 9, wherein the second current control unit comprises:
a first bias transistor suitable for having a source-drain path coupled between a power supply voltage terminal and a first node and having a gate to which a bias signal is inputted;
a first tail current control unit suitable for being coupled between the first node and a ground voltage terminal and controlling the tail current of the second main input transistor in response to the first input signal;
a second bias transistor suitable for having a source-drain path coupled between the power supply voltage terminal and a second node and having a gate to which the bias signal is inputted; and
a second tail current control unit suitable for being coupled between the second node and the ground voltage terminal and controlling the tail current of the first main input transistor in response to the second input signal.

18. The differential amplifier circuit of claim 17, wherein the first tail current control unit comprises:
a third sub-input transistor suitable for having a source-drain path coupled between the first node and a source of the second main input transistor and having a gate to which the first input signal is inputted; and a first current sink transistor suitable for having a source-drain path coupled between the source of the second main input transistor and the ground voltage terminal and having a gate to which a voltage of the first node is inputted.

19. The differential amplifier circuit of claim 17, wherein the second tail current control unit comprises:
a fourth sub-input transistor suitable for having a source-drain path coupled between the second node and a source of the first main input transistor and having a gate to which the second input signal is inputted; and
a second current sink transistor suitable for having a source-drain path coupled between the source of the first main input transistor and the ground voltage terminal and having a gate to which a voltage of the second node is inputted.

20. The differential amplifier circuit of claim 9, wherein the output unit is suitable for:
re-mirroring the current of the second input signal mirrored by the second current mirroring unit, and
generating the output voltage by adding the re-mirrored current of the second input signal to the current of the first input signal mirrored by the first current mirroring unit.

21. A semiconductor memory device comprising:
a memory cell array suitable for comprising a plurality of memory cells coupled to a plurality of bit line pairs and a plurality of word lines;
a peripheral circuit suitable for reading data from a memory cell corresponding to an input address when a read operation is performed and programming data into a memory cell corresponding to an input address when a program operation is performed; and
a voltage regulator suitable for supplying a constant supply voltage to the peripheral circuit,
wherein the voltage regulator comprises a differential amplifier suitable for reducing a current flowing through a current mirroring unit for mirroring a positive input signal and a negative input signal by supplying a positive input terminal with a first compensation current generated in response to the negative input signal and supplying a negative input terminal with a second compensation current generated in response to the positive input signal and for simultaneously controlling a tail current of the negative input terminal in response to the positive input signal and controlling a tail current of the positive input terminal in response to the negative input signal.

22. The semiconductor memory device of claim 21, wherein the voltage regulator comprises:
the differential amplifier;
a driving transistor suitable for being turned on in response to an output voltage of the differential amplifier and outputting an external power supply voltage as a supply voltage; and
a voltage distribution circuit suitable for outputting a feedback voltage generated by dividing the supply voltage as the positive input signal of the differential amplifier.

23. The semiconductor memory device of claim 21, wherein the differential amplifier comprises:
first and second main input units suitable for receiving the positive input signal and the negative input signal, respectively;
a first current mirroring unit suitable for being coupled to a first terminal of the first main input unit and mirroring a current of the positive input signal inputted to the first main input unit;
a second current mirroring unit suitable for being coupled to a first terminal of the second main input unit and mirroring a current of the negative input signal inputted to the second main input unit;
an output unit suitable for generating the output voltage based on results of the mirroring of the first current mirroring unit and the second current mirroring unit;
a first current control unit suitable for reducing a current mirrored by the first current mirroring unit by supplying the first terminal of the first main input unit with the first compensation current generated by re-mirroring the negative input signal and reducing a current mirrored by the second current mirroring unit by supplying the first terminal of the second main input unit with the second compensation current generated by re-mirroring the positive input signal; and
a second current control unit suitable for controlling a tall current of the first main input unit in response to the negative input signal and controlling a tail current of the second main input unit in response to the positive input signal.

24. The semiconductor memory device of claim 23, wherein the first current control unit comprises:
a first sub-input unit suitable for having a first terminal coupled to a second terminal of the first main input unit and receiving the positive input signal;
a second sub-input unit suitable for having a first terminal coupled to a second terminal of the second main input unit and receiving the negative input signal;
a third current mirroring unit suitable for being coupled to a second terminal of the first sub-input unit and supplying the first terminal of the second main input unit with the second compensation current generated by re-mirroring the current of the positive input signal inputted to the first sub-input unit; and
a fourth current mirroring unit suitable for being coupled to a second terminal of the second sub-input unit and supplying the first terminal of the first main input unit with the first compensation current generated by re-mirroring the current of the negative input signal inputted to the second sub-input unit.

25. The semiconductor memory device of claim 23, wherein the second current control unit comprises:
a first bias supply unit suitable for being coupled between a power supply voltage terminal and a first node and being turned on in response to a bias signal;
a first tail current control unit suitable for being coupled between the first node and a ground voltage terminal and controlling the tail current of the second main input unit in response to the positive input signal;
a second bias supply unit suitable for being coupled between the power supply voltage terminal and a second node and being turned on in response to the bias signal; and
a second tail current control unit suitable for being coupled between the second node and the ground voltage terminal and controlling the tail current of the first main input unit in response to the negative input signal.

* * * * *